US010100520B2

(12) United States Patent
Abe

(10) Patent No.: US 10,100,520 B2
(45) Date of Patent: Oct. 16, 2018

(54) PANEL UNIT

(71) Applicant: PANASONIC INTELLECTUAL PROPERTY MANAGEMENT CO., LTD., Osaka (JP)

(72) Inventor: Hiroyuki Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/513,910

(22) PCT Filed: Sep. 30, 2015

(86) PCT No.: PCT/JP2015/004962
§ 371 (c)(1),
(2) Date: Mar. 23, 2017

(87) PCT Pub. No.: WO2016/051786
PCT Pub. Date: Apr. 7, 2016

(65) Prior Publication Data

US 2017/0284096 A1 Oct. 5, 2017

(30) Foreign Application Priority Data

Sep. 30, 2014 (JP) ................................ 2014-200966

(51) Int. Cl.
*H05K 7/20* (2006.01)
*E04C 2/52* (2006.01)
(Continued)

(52) U.S. Cl.
CPC ................ *E04C 2/526* (2013.01); *E04B 1/74* (2013.01); *E04B 1/76* (2013.01); *E04C 2/08* (2013.01);
(Continued)

(58) Field of Classification Search
CPC . E04B 1/7612; E04B 1/76; E04B 1/74; E04B 1/80; E04B 1/803; E04B 1/806; E04C 2/3405; F28F 2013/008; E06B 3/6715
See application file for complete search history.

(56) References Cited

U.S. PATENT DOCUMENTS 3,399,717 A * 9/1968 Cline ...................... F28D 15/06 165/104.26
3,463,224 A * 8/1969 Myers ...................... B64G 1/50 165/185
(Continued)

FOREIGN PATENT DOCUMENTS

JP H01-145497 A 6/1989
JP H09-205083 A 8/1997
(Continued)

OTHER PUBLICATIONS

International Search and Written Opinion issued in International Patent Application No. PCT/JP2015/004962, dated Dec. 22, 2015; with partial English translation.
(Continued)

*Primary Examiner* — Gisele D Ford
(74) *Attorney, Agent, or Firm* — McDermott Will & Emery LLP

(57) ABSTRACT

The panel unit includes a first panel, a second panel facing the first panel with a space provided therebetween the first panel and the second panel, a partition separating the space from a surrounding space, and a switching mechanism. The switching mechanism is located in the space for allowing a change in thermal conductivity between the first panel and the second panel. The switching mechanism includes at least one connector which is thermally conductive, and is switchable between a first state in which the at least one connector is out of contact with the first panel or the second
(Continued)

panel and a second state in which the at least one connector is in contact with both the first panel and the second panel.

13 Claims, 8 Drawing Sheets

(51) Int. Cl.

| | |
|---|---|
| ***E04B 1/76*** | (2006.01) |
| ***E04C 2/08*** | (2006.01) |
| ***E04C 2/34*** | (2006.01) |
| ***E06B 3/67*** | (2006.01) |
| ***E04B 1/74*** | (2006.01) |
| *E04B 1/80* | (2006.01) |

(52) U.S. Cl.
CPC .............. *E04C 2/34* (2013.01); *E06B 3/6715* (2013.01); *E04B 1/803* (2013.01)

(56) References Cited

U.S. PATENT DOCUMENTS

| | | | | | |
|---|---|---|---|---|---|
| 3,519,067 | A * | 7/1970 | Schmidt | F28D 15/046 | 165/104.26 |
| 3,957,107 | A * | 5/1976 | Altoz | F28D 15/06 | 165/104.26 |
| 5,014,481 | A * | 5/1991 | Moe | E04B 1/74 | 52/406.3 |
| 5,156,087 | A * | 10/1992 | Cusson | B29C 43/52 | 100/322 |
| 9,025,333 | B1 * | 5/2015 | Spowart | F28F 13/00 | 165/276 |
| 2002/0020142 | A1 * | 2/2002 | Swiszcz | B31D 3/00 | 52/783.1 |
| 2002/0043895 | A1 * | 4/2002 | Richards | F02B 75/34 | 310/328 |
| 2003/0154679 | A1 * | 8/2003 | Swiszcz | E04B 9/001 | 52/506.07 |
| 2003/0223174 | A1 | 12/2003 | Prophet | | |
| 2004/0237441 | A1 * | 12/2004 | Swiszcz | E04B 9/0457 | 52/506.01 |
| 2005/0158573 | A1 * | 7/2005 | Elzey | C22F 1/006 | 428/593 |
| 2006/0066434 | A1 * | 3/2006 | Richards | B82Y 30/00 | 337/14 |
| 2007/0257766 | A1 * | 11/2007 | Richards | B82Y 10/00 | 337/298 |
| 2009/0184798 | A1 * | 7/2009 | Vaidyanathan | B64G 1/50 | 337/298 |
| 2009/0194263 | A1 * | 8/2009 | Bernardes | F28F 13/00 | 165/138 |
| 2009/0205280 | A1 * | 8/2009 | Coppersmith | E04B 1/803 | 52/506.01 |
| 2009/0218087 | A1 * | 9/2009 | Oshima | C09K 5/14 | 165/185 |
| 2009/0233038 | A1 * | 9/2009 | Coppersmith | B29C 55/24 | 428/69 |
| 2009/0277608 | A1 * | 11/2009 | Kamins | F25D 19/006 | 165/82 |
| 2010/0039208 | A1 * | 2/2010 | Epstein | F28F 13/16 | 337/21 |
| 2012/0247707 | A1 * | 10/2012 | Surdeanu | F21V 29/00 | 165/10 |
| 2013/0314202 | A1 * | 11/2013 | Bolton | F28F 13/00 | 337/299 |
| 2015/0090436 | A1 * | 4/2015 | Andres | F28F 13/14 | 165/276 |
| 2015/0152635 | A1 | 6/2015 | Duforestel et al. | | |
| 2015/0176266 | A1 * | 6/2015 | Duforestel | E04B 1/74 | 165/136 |

FOREIGN PATENT DOCUMENTS

| | | | |
|---|---|---|---|
| JP | 2001-322840 | A | 11/2001 |
| JP | 3620922 | B2 | 2/2005 |
| JP | 2005-527963 | A | 9/2005 |
| JP | 2006-9949 | A | 1/2006 |
| JP | 2008-032071 | A | 2/2008 |
| JP | 2008-063158 | A | 3/2008 |
| JP | 2010-025511 | A | 2/2010 |
| JP | 2013-538359 | A | 10/2013 |
| WO | 2004/006295 | A2 | 1/2004 |
| WO | 2011/153214 | A2 | 12/2011 |
| WO | 2013/186225 | A1 | 12/2013 |

OTHER PUBLICATIONS

Decision of Refusal issued in corresponding Japanese Patent Application No. 2016-551549 dated Jan. 23, 2018 (with English translation).

* cited by examiner

PANEL UNIT

RELATED APPLICATIONS

This application is the U.S. National Phase under 35 U.S.C. § 371 of International Patent Application No. PCT/JP2015/004962, filed on Sep. 30, 2015, which in turn claims the benefit of Japanese Application No. 2014-200966, filed on Sep. 30, 2014, the disclosures of which applications are incorporated by reference herein.

TECHNICAL FIELD

The present invention relates to panel units, and specifically to a panel unit including a first panel and a second panel with a space provided therebetween, wherein the thermal conductivity between the first panel and the second panel is switchable.

BACKGROUND ART

JP 2008-32071 A (hereinafter referred to as "Document 1") describes a thermal insulating member having thermal conductivity which is adjustable. The thermal conductivity of the thermal insulating member is adjusted by changing the internal pressure of a heat insulation container.

JP 2010-25511 A (hereinafter referred to as "Document 2") describes a plate member having variable thermal conductivity. The plate member includes two thermally conductive members each having a plate shape and a mechanism for controlling the amount of gas which are disposed in a space enclosed in a casing, and the amount of the gas is controlled to change the thickness of the casing. In the case of the plate member, in a state in which the casing has a small thickness, the two thermally conductive members are in contact with each other, thereby forming a heat transfer path. In a state in which the casing has a large thickness, a space is provided between the two thermally conductive members, thereby shutting down the heat transfer path.

SUMMARY OF INVENTION

The thermal insulating member described in Document 1 is configured such that the thermal conductivity is changed by changing the internal pressure, and therefore, the change in thermal conductivity is about 10-fold.

In the plate member described in Document 2, the change in thermal conductivity is about 100-fold. However, in the plate member, in order to shut down the heat transfer path between the two thermally conductive materials, the thickness of the casing has to be increased, and therefore, the entire external shape of the plate member changes when the thermal conductivity is changed.

It is an object of the present invention to provide a panel unit capable of significantly changing its thermal conductivity without changing its external shape.

A panel unit according to one aspect of the present invention includes a first panel, a second panel, a partition, and a switching mechanism.

The second panel faces the first panel with a space provided therebetween.

The partition is located between the first panel and the second panel and separates the space from a surrounding space.

The switching mechanism is located in the space to allow a change in the thermal conductivity between the first panel and the second panel.

The switching mechanism includes at least one connector which is thermally conductive, and the switching mechanism is switchable between a first state in which the at least one connector is out of contact with the first panel or the second panel and a second state in which the at least one connector is in thermally conductive contact with both the first panel and the second panel.

In the panel unit according to another aspect of the present invention, the space is preferably a thermal insulation space having a reduced pressure or being filled with a thermal insulating gas.

In the panel unit according to another aspect of the present invention, the space is preferably a thermal insulation space having a reduced pressure, and a mean free path $\lambda$ of gas in the space and a distance D between the first panel and the second panel are preferably in a relationship expressed as $\lambda/D>0.3$.

The panel unit according to another aspect of the present invention preferably further includes a spacer maintaining a distance between the first panel and the second panel.

In the panel unit according to another aspect of the present invention, the at least one connector preferably includes a fixed end fixed to one of the first panel and the second panel and a movable end fixed to neither the first panel nor the second panel, wherein the movable end is preferably out of contact with the other of the first panel and the second panel in the first state, and the movable end is preferably in thermally conductive contact with the other of the first panel and the second panel in the second state.

In the panel unit according to another aspect of the present invention, the at least one connector preferably causes displacement of the movable end in the space due to a change in electric energy given thereto.

In the panel unit according to another aspect of the present invention, the at least one connector is preferably entirely or partially made of a conductor such that changing an electric field in the space displaces the movable end in the space.

In the panel unit according to another aspect of the present invention, the at least one connector is preferably entirely or partially formed as a piezoelectric actuator such that applying a voltage thereacross displaces the movable end in the space.

In the panel unit according to another aspect of the present invention, the at least one connector is preferably configured to generate electrical repulsion for displacing the movable end in the space when a voltage is applied thereacross.

In the panel unit according to another aspect of the present invention, the at least one connector is preferably entirely or partially formed as an electrostatic actuator such that applying a voltage thereacross displaces the movable end in the space.

In the panel unit according to another aspect of the present invention, the at least one connector preferably causes displacement of the movable in the space due to a change in magnetic energy given thereto.

In the panel unit according to another aspect of the present invention, the at least one connector is preferably entirely or partially made of a magnetic substance such that changing a magnetic field in the space displaces the movable end in the space.

In the panel unit according to another aspect of the present invention, the at least one connector preferably causes displacement of the movable end in the space due to a change in thermal energy given thereto.

In the panel unit according to another aspect of the present invention, the at least one connector is preferably entirely or partially made of bimetal such that changing a temperature in the space displaces the movable end in the space.

In the panel unit according to another aspect of the present invention, the at least one connector is preferably entirely or partially made of a shape-memory alloy such that changing a temperature in the space displaces the movable end in the space.

DESCRIPTION OF EMBODIMENTS

First Embodiment

Figure 1A:
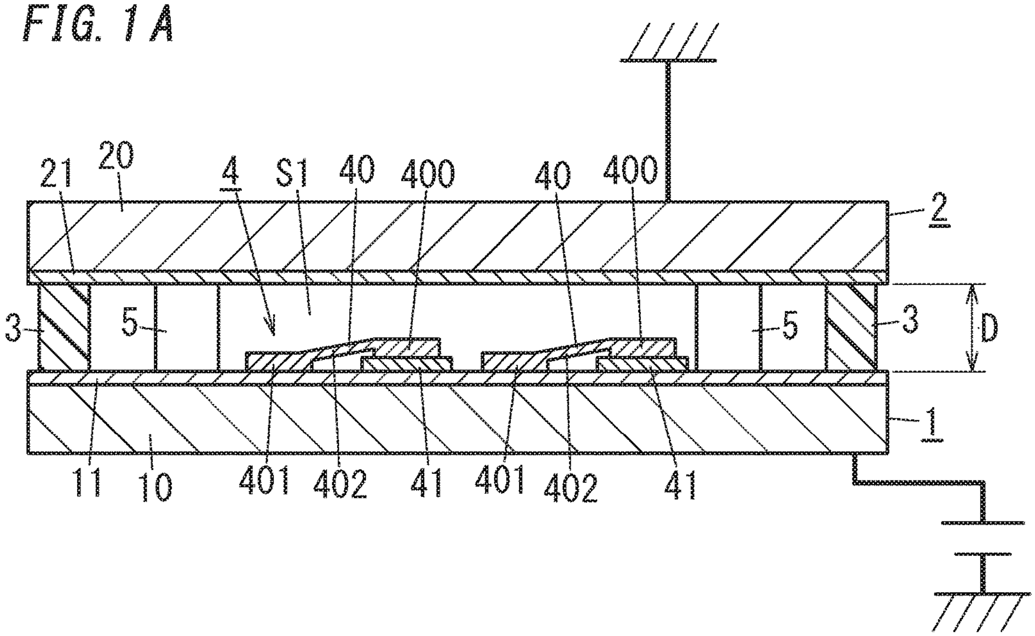
FIG. 1A is a sectional view schematically illustrating a first state of a panel unit of the first embodiment.
Figure 1B:
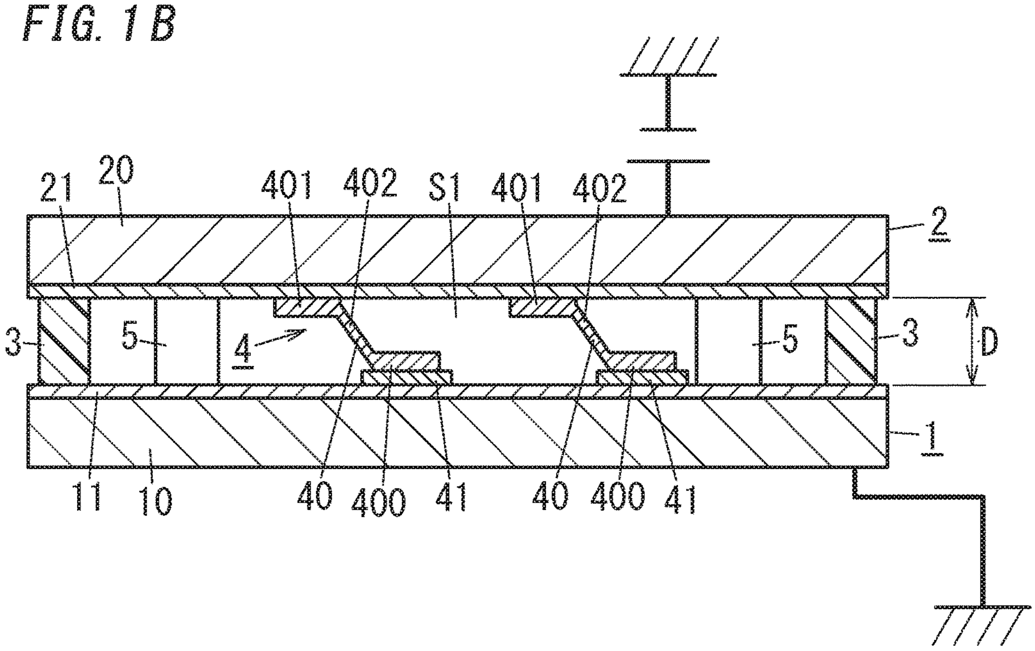
FIG. 1B is a sectional view schematically illustrating a second state of the panel unit of the first embodiment.

FIGS. 1A and 1B schematically illustrate a panel unit of the first embodiment. The panel unit of the present embodiment includes a first panel 1 and a second panel 2 between which a space S1 hermetically enclosed with a partition 3 is provided. In the space S1, a switching mechanism 4 is disposed and is operated by electric energy to switch the thermal conductivity of the panel unit of the present embodiment.

The thermal conductivity here is a value expressing the ease of heat conduction between the first panel 1 and the second panel 2, and specifically a value [W/mK] obtained by dividing the quantity of heat passing through an unit area per unit time between the first panel 1 and the second panel 2 by a temperature gradient.

A high thermal conductivity between the first panel 1 and the second panel 2 means a state in which heat easily transfers between the first panel 1 and the second panel 2. A low thermal conductivity between the first panel 1 and the second panel 2 means a state in which heat does not easily transfer between the first panel 1 and the second panel 2 (in other words, a highly insulated state).

The first panel 1 and the second panel 2 face each other. The first panel 1 and the second panel 2 are parallel to each other. The term “parallel” here does not mean parallel in a strict sense, but an inclination at a certain degree is allowable.

The first panel 1 includes a panel 10 made of aluminum and having gas barrier properties. To fabricate the panel 10, other materials such as glass may be used as long as they have high gas barrier properties.

The panel 10 has a surface which faces the second panel 2 and on which a dielectric 11 as a thin film is formed. The first panel 1 includes the panel 10 and the dielectric 11.

The second panel 2 includes a panel 20 made of aluminum and having gas barrier properties. To fabricate the panel 20, other materials such as glass may be used as long as they have high gas barrier properties.

The panel 20 has a surface which faces the first panel 1 and on which a dielectric 21 as a thin film is formed. The second panel 2 includes the panel 20 and the dielectric 21.

The first panel 1 and the second panel 2 are arranged at a small distance D from each other to provide a space S1 therebetween. In the panel unit of the present embodiment, the space S1 which is very small is provided between the dielectric 11 of the first panel 1 and the dielectric 21 of the second panel 2.

The panel unit of the present embodiment further includes the partition 3 located between the first panel 1 and the second panel 2, and a plurality of spacers 5 located between the first panel 1 and the second panel 2.

The partition 3 separates, from a surrounding space, the space S1 located between the first panel 1 and the second panel 2 so that the space S1 is a hermetically enclosed space. The partition 3 is a frame-shaped partition wall entirely enclosing the space S1.

The partition 3 is made of an adhesive having gas barrier properties and thermal insulating properties to have a frame shape. The first panel 1 and the second panel 2 are bonded to each other via the partition 3.

The space S1 is hermetically sealed off from the surrounding space by the first panel 1, the second panel 2, and the partition 3 each of which has gas barrier properties.

Air in the space S1, which is hermetically enclosed, is discharged using a pump, and thus, the space S1 is a thermal insulation space having a pressure reduced to or below a predetermined value. The predetermined value is, for example, 0.1 [Pa]. The space having a pressure reduced to or below 0.1 [Pa] is a so-called vacuum space.

The space S1, which is hermetically enclosed, is not necessarily a thermal insulation space having a reduced pressure as in the case of the panel unit of the present embodiment, but the space S1 may be a thermal insulation space filled with a gas such as Ar or Kr having high thermal insulating properties.

Moreover, the partition 3 may be made of a thermal insulating material (glass fiber, resin fiber, or the like) which does not have gas barrier properties. In this case, the space S1 is a space which is not enclosed in an airtight manner.

The plurality of spacers 5 are members for maintaining the distance D between the first panel 1 and the second panel 2.

The plurality of spacers 5 are arranged in the space S1 at intervals. It is sufficient that at least one spacer 5 is disposed in the space S1. Each spacer 5 is made of a material having thermal insulating properties and has, for example, a columnar shape. Each spacer 5 may be made of a transparent material.

The switching mechanism 4 included in the panel unit of the present embodiment is located in the space S1 and is operated by electric energy provided externally, thereby switching the thermal conductivity between the first panel 1 and the second panel 2.

The switching mechanism 4 includes a plurality of connectors 40 located in the space S1. Each connector 40 is made of metal (an electric conductor) such as aluminum having thermal conductivity. In the figure, two connectors 40 are shown for the sake of simplicity, but three or more connectors 40 may be provided, or only one connector 40 may be provided.

Each connector 40 includes a fixed end 400, a movable end 401, and a connection part 402, which are formed integrally.

The fixed end 400 is fixed to a ground electrode 41 on the surface of the first panel 1 facing the second panel 2. The fixed end 400 is not displaceable in the space S1.

The movable end 401 is a part fixed to neither the first panel 1 nor the second panel 2. The movable end 401 is connected via the connection part 402 to the fixed end 400. The displacement of the movable end 401 in the space S1 is restricted within a predetermined area by the connection part 402.

In the panel unit of the present embodiment, an electric field generated in the space S1 is changed by switching a manner of applying a voltage between the first panel 1 and the second panel 2.

FIG. 1A shows a state in which a voltage is applied to the first panel 1 and the second panel 2 is grounded. This state is referred to as a first state of the panel unit of the present embodiment.

When a voltage is applied to the first panel 1, an electric field generated in the space S1 generates electrical attraction force for the movable end 401 located in the electric field and made of aluminum in a direction in which the movable end 401 approaches the first panel 1.

In the first state, the movable end 401, which is a part of each connector 40, is in contact with the first panel 1 (the dielectric 11). In the first state, both the fixed end 400 and the movable end 401 of each connector 40 are in contact with the first panel 1. In contrast, no part of each connector 40 is in contact with the second panel 2.

FIG. 1B shows a state in which a voltage is applied to the second panel 2, and the first panel 1 is connected to ground. This state is referred to as a second state of the panel unit of the present embodiment.

When a voltage is applied to the second panel 2, an electric field generated in the space S1 generates electrical attraction force for the movable end 401 located in the electric field and made of aluminum in a direction in which the movable end 401 approaches the second panel 2. The direction of the electric field generated in the space S1 in the first state is opposite to the direction of the electric field generated in the space S1 in the second state.

In the second state, the movable end 401, which is a part of each connector 40, is in contact with the second panel 2 (the dielectric 21). In the second state, the fixed end 400 of each connector 40 is in contact with the first panel 1 via the ground electrode 41. The first panel 1 and the second panel 2 are in a heat conductive state via the connectors 40.

As described above, in the panel unit of the present embodiment, the switching mechanism is switchable between the first state in which each connector 40 located in the space S1 is in thermally conductive contact with only the first panel 1 and the second state in which each connector 40 is in thermally conductive contact with both the first panel 1 and the second panel 2.

In the first state, the space S1 serving as a thermal insulation space is provided between the first panel 1 and the second panel 2, and the partition 3 and the spacer 5 which are in contact with the first panel 1 and the second panel 2 have thermal insulating properties.

Therefore, the panel unit of the present embodiment has high thermal insulating properties in the first state, and the thermal conductivity between the first panel 1 and the second panel 2 has a very small value.

In contrast, the panel unit of the present embodiment has low thermal insulating properties in the second state, and the thermal conductivity between the first panel 1 and the second panel 2 has a much larger value than the value of the thermal conductivity in the first state.

In particular, in the panel unit of the present embodiment, the space S1 is a reduced pressure space having a pressure reduced to a vacuum, and the space S1 has high thermal insulating properties. Therefore, the thermal conductivity in the second state can be changed to a thermal conductivity 10000 or more times as high as the thermal conductivity in the first state.

The panel unit of the present embodiment further provides an advantage that switching between the first state and the second state changes only a shape of each connector 40 in the space S1, but the external shape of the panel unit does not change.

Moreover, if, when the space S1 is a thermal insulation space having a reduced pressure as in the case of the panel unit of the present embodiment, a relationship expressed by following Formula 1 holds true between the mean free path (λ)[m] of gas in the space S1 and the distance (D) [m] between the first panel 1 and the second panel 2, an advantage that the thermal conductivity is independent of the distance (D) is obtained.

$$\lambda/D>0.3 \quad \text{(Formula 1)}$$

That is, when the relationship expressed by Formula 1 holds true, a panel unit having high thermal insulating properties in the first state can be easily formed into a thin shape. In other words, it is possible to thin a panel unit capable of significantly changing its thermal conductivity between the first state and the second state.

Second Embodiment

Figure 2A:
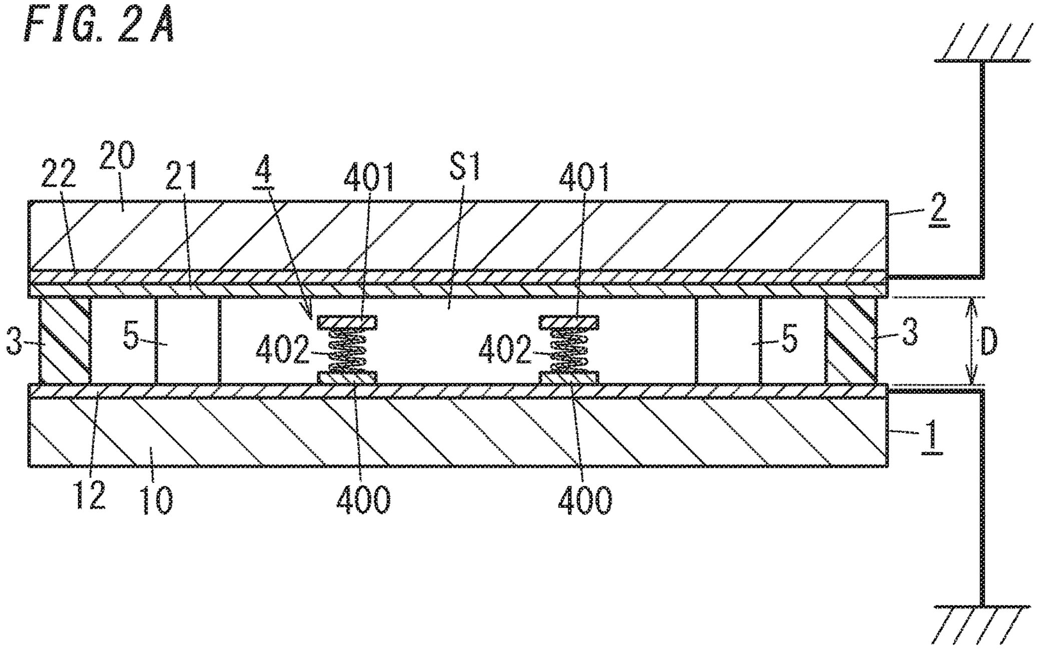
FIG. 2A is a sectional view schematically illustrating a first state of a panel unit of the second embodiment.
Figure 2B:
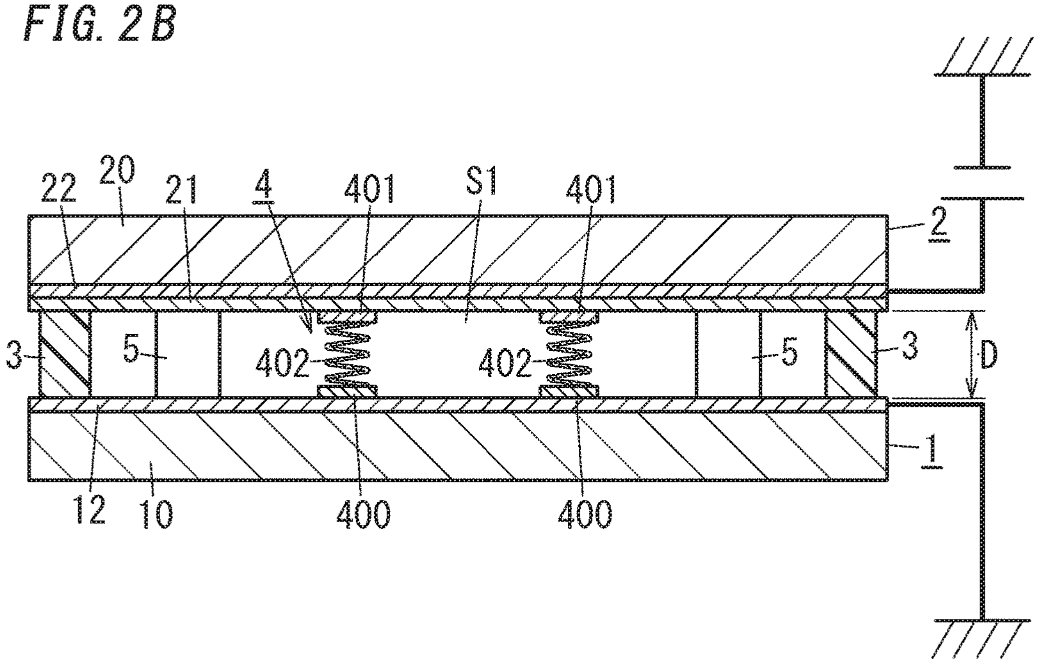
FIG. 2B is a sectional view schematically illustrating a second state of the panel unit of the second embodiment.

FIGS. 2A and 2B schematically show a panel unit of the second embodiment.

In the present embodiment, the same components as those in the first embodiment will not be described in detail below, and components different from those shown in the first embodiment will be described in detail with reference to the drawings. In the figure, the same components as those in the first embodiment will be indicated by the same reference signs as those used in the first embodiment.

Similarly to the panel unit of the first embodiment, the panel unit of the present embodiment includes a first panel 1 and a second panel 2 between which a space S1 hermetically enclosed with a partition 3 is provided. In the space S1, a switching mechanism 4 is disposed and is operated by electric energy to allow a change in the thermal conductivity.

The panel unit of the present embodiment includes connectors 40 disposed in the space S1, and at least a part of each connector 40 has a spring characteristic. Each connector 40 includes a fixed end 400, a movable end 401, and a connection part 402 mechanically and thermally connecting the fixed end 400 to the movable end 401, and the connection part 402 serves as an elastically deformable part. The connection part 402 may have any structure as long as at least a part of the connection part 402 is elastically deformable.

When electrical attraction force is exerted on the movable end 401 in the space S1, the connection part 402 elastically deforms and extends, thereby displacing the movable end 401. When the electrical attraction force is no longer exerted on the movable end 401, the connection part 402 returns to its initial form, thereby displacing the movable end 401 to its initial position.

In the panel unit of the present embodiment, the first panel 1 includes a panel 10 having a surface which faces the second panel 2 and on which a ground electrode 12 is formed. The second panel 2 includes a panel 20 having a surface which faces the first panel 1 and on which an electrode 22 and a dielectric 21 are formed. The electrode 22 is located between the panel 20 and the dielectric 21.

The panel unit of the present embodiment is configured such that switching a state of application of a voltage (on/off of voltage application) to the first panel 1 and the second panel 2 changes an electric field generated in the space S1.

FIG. 2A shows a state in which the electrode 22 of the second panel 2 is connected to ground, and a voltage is applied to neither the first panel 1 nor the second panel 2. This state is referred to as a first state of the panel unit of the present embodiment. In the first state, in the space S1, the electric field generating the electrical attraction force exerted on the movable end 401 made of aluminum is not generated.

In the space S1, the movable end 401 is supported by the connection part 402 and is maintained in a position away from the second panel 2.

FIG. 2B shows a state in which a voltage is applied to the electrode 22 of the second panel 2. This state is referred to as a second state of the panel unit of the present embodiment.

When a voltage is applied to the electrode 22 of the second panel 2, an electric field is generated in the space S1. This electric field generates electrical attraction force in a direction in which the movable end 401 approaches the second panel 2.

The electrical attraction force generated in the second state brings the movable end 401 which is a part of each connector 40 into thermally conductive contact with the second panel 2. In the second state, the fixed end 400 of each connector 40 is in thermally conductive contact with the ground electrode 12 of the first panel 1. The first panel 1 and the second panel 2 are in a thermal conductive state via the connectors 40.

As described above, in the panel unit of the present embodiment, each connector 40 located in the space S1 is switchable between the first state shown in FIG. 2A and the second state shown in FIG. 2B.

In the first state, the thermal conductivity between the first panel 1 and the second panel 2 has a very small value. In the second state, the thermal conductivity between the first panel 1 and the second panel 2 has a much larger value than that in the first state (for example, a value about 10000 times as large as the value in the first state).

The panel unit of the present embodiment further provides an advantage that application of a voltage is not required to maintain the switching mechanism in the first state.

In the figure, two connectors 40 are shown for the sake of simplicity, but three or more connectors 40 may be provided, or only one connector 40 may be provided.

Third Embodiment

Figure 3A:
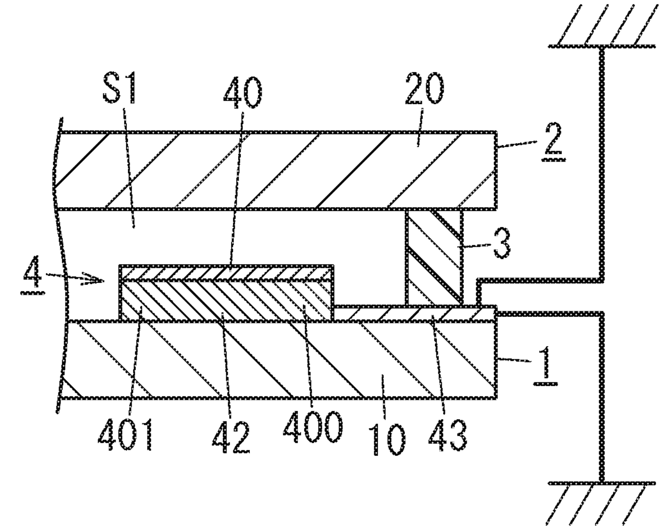
FIG. 3A is a sectional view schematically illustrating a first state of a main part of a panel unit of the third embodiment.
Figure 3B:
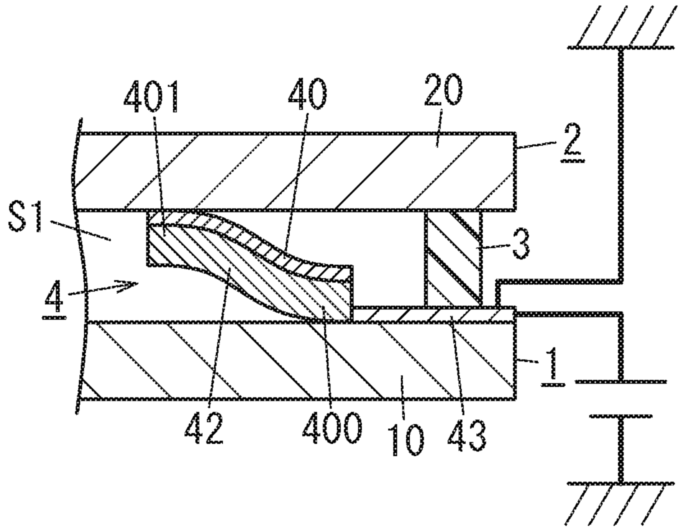
FIG. 3B is a sectional view schematically illustrating a second state of the main part of the panel unit of the third embodiment.

FIGS. 3A and 3B schematically illustrate a main part of a panel unit of the third embodiment.

In the present embodiment, the same components as those in the first embodiment will not be described in detail below, and components different from those shown in the first embodiment will be described in detail with reference to the drawings. In the figure, the same components as those in the first embodiment will be indicated by the same reference characters as those used in the first embodiment.

Similarly to the panel unit of the first embodiment, the panel unit of the present embodiment includes a first panel 1 and a second panel 2 between which a space S1 hermetically enclosed with a partition 3 is provided. In the space S1, a switching mechanism 4 is disposed and is operated by electric energy to switch the thermal conductivity.

In the panel unit of the present embodiment, the switching mechanism 4 includes connectors 40 each of which is formed as a piezoelectric actuator 42. The piezoelectric actuator 42 is an actuator formed by stacking a plurality of piezoelectric elements having a property of expansion and contraction in response to application of a voltage.

Each connector 40 included in the panel unit of the present embodiment is entirely formed as the piezoelectric actuator 42. The piezoelectric actuator 42 has one end serving as a fixed end 400 of the connector 40 and the other end located on an opposite side of the fixed end 400 and serving as a movable end 401 of the connector 40. Alternatively, only a part of the connector 40 may be formed as the piezoelectric actuator 42.

The first panel 1 includes a panel 10 having gas barrier properties. The second panel 2 includes a panel 20 having gas barrier properties. The panel 10 of the first panel 1 has a surface which faces the second panel 2 and on which an electrode 43 for allowing application of a voltage to the piezoelectric actuator 42 is formed.

When a predetermined voltage is applied to the piezoelectric actuator 42 via the electrode 43, the piezoelectric actuator 42 changes in shape, thereby displacing the movable end 401. When the voltage is no longer applied to the piezoelectric actuator 42, the piezoelectric actuator 42 returns to its initial form, thereby displacing the movable end 401 to its initial position.

The panel unit of the present embodiment is configured such that switching a state of application of a voltage (on/off of voltage application) to the piezoelectric actuator 42 deforms the piezoelectric actuator 42 in the space S1.

FIG. 3A shows a state in which no voltage is applied to the piezoelectric actuator 42. This state is referred to as a first state of the panel unit of the present embodiment. In the first state, the movable end 401 is located away from the second panel 2.

FIG. 3B shows a state in which a predetermined voltage is applied to the piezoelectric actuator 42. This state is referred to as a second state of the panel unit of the present embodiment.

In the second state, the piezoelectric actuator 42 deforms due to application of a voltage, and the movable end 401 of the connector 40 comes into thermally conductive contact with the second panel 2. In the second state, the fixed end 400 is in thermally conductive contact with the first panel 1. The first panel 1 and the second panel 2 are in a thermally conductive state via the piezoelectric actuator 42 included in the connector 40.

As described above, in the panel unit of the present embodiment, each connector 40 located in the space S1 is operated by electric energy (application of a voltage to each connector 40), and therefore, the switching mechanism is switchable between the first state shown in FIG. 3A and the second state shown in FIG. 3B.

The panel unit of the present embodiment further provides an advantage that application of a voltage is not required to maintain the switching mechanism in the first state, an advantage that each connector 40 is rapidly deformable by a relatively small voltage, and an advantage that the electrode 43 is required only to be formed on the first panel 1.

In the figure, only one connector 40 is shown for the sake of simplicity, but one or more connectors 40 may be disposed in the space S1.

Fourth Embodiment

Figure 4A:
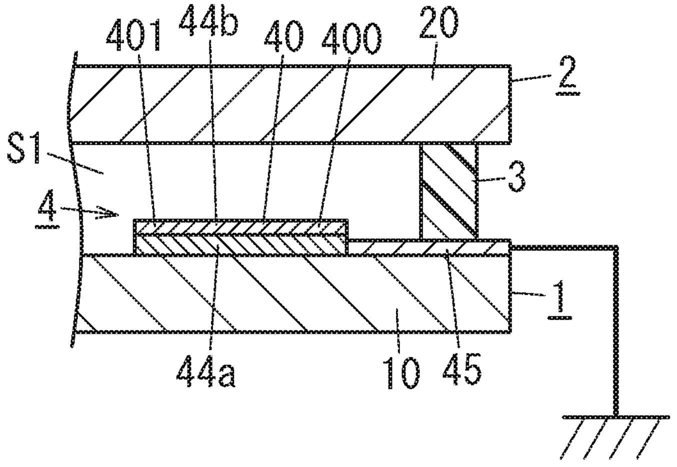
FIG. 4A is a sectional view schematically illustrating a first state of a main part of a panel unit of the fourth embodiment.
Figure 4B:
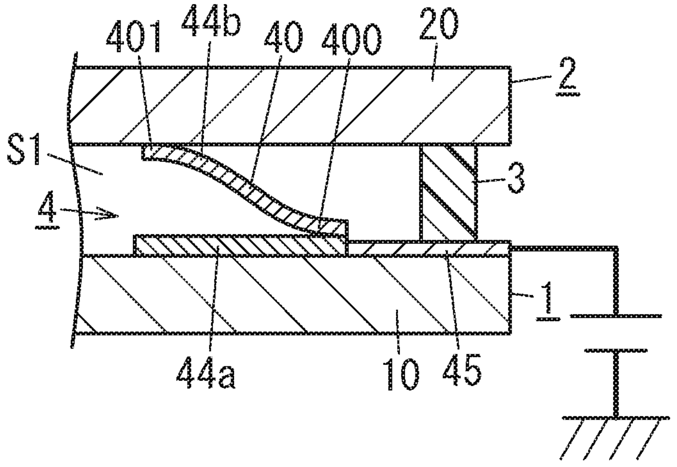
FIG. 4B is a sectional view schematically illustrating a second state of the main part of the panel unit of the fourth embodiment.

FIGS. 4A and 4B schematically illustrate a main part of a panel unit of the fourth embodiment.

In the present embodiment, the same components as those in the first embodiment will not be described in detail below, and components different from those shown in the first embodiment will be described in detail with reference to the drawings. In the figure, the same components as those in the first embodiment will be indicated by the same reference characters as those used in the first embodiment.

Similarly to the panel unit of the first embodiment, the panel unit of the present embodiment includes a first panel 1 and a second panel 2 between which a space S1 hermetically enclosed with a partition 3 is provided. In the space S1, a switching mechanism 4 is disposed and is operated by electric energy to switch the thermal conductivity.

In the panel unit of the present embodiment, the switching mechanism 4 includes connectors 40 each including members 44*a* and 44*b* which are thermally conductive and which are capable of generating electrical repulsion in directions in which the members 44*a* and 44*b* are separated from each other. The members 44*a* and 44*b* are in a pair. One of the members 44*a* and 44*b*, here, the member 44*a* (hereinafter referred to as a "first member 44*a*") is fixed to the first panel 1. The other of the members 44*a* and 44*b*, here, the member 44*b* (hereinafter referred to as a "second member 44*b*") has a fixed end 400 and a movable end 401.

The first member 44*a* and the second member 44*b* are disposed to face each other. The first member 44*a* and the second member 44*b* are both electrically connected to an electrode 45 included in the first panel 1.

The first panel 1 includes a panel 10 having gas barrier properties. The second panel 2 includes a panel 20 having gas barrier properties. The panel 10 of the first panel 1 has a surface which faces the second panel 2 and on which the electrode 45 is formed.

When a predetermined voltage is applied between the first member 44*a* and the second member 44*b* via the electrode 45, electrical repulsion is generated between the first member 44*a* and the second member 44*b*, thereby deforming the second member 44*b*. The deformation of the second member 44*b* displaces the movable end 401 to a position at which the movable end 401 is in thermally conductive contact with the second panel 2.

When the voltage is no longer applied to the electrode 45, the second member 44*b* returns to its initial form, thereby displacing the movable end 401 to its initial position.

FIG. 4A shows a state in which no voltage is applied to the electrode 45 and the electrode 45 is connected to ground. This state is referred to as a first state of the panel unit of the present embodiment. In the first state, the movable end 401 is located away from the second panel 2.

FIG. 4B shows a state in which a predetermined voltage is applied to the electrode 45. This state is referred to as a second state of the panel unit of the present embodiment. In the second state, of the first member 44*a* and the second member 44*b* in the pair, at least the second member 44*b* deforms due to electrical repulsion, thereby bringing the movable end 401 into thermally conductive contact with the second panel 2. In the second state, the fixed end 400 is in thermally conductive contact with the first panel 1. The first panel 1 and the second panel 2 are in a thermally conductive state via the first member 44*a* and the second member 44*b* included in the connector 40.

As described above, in the panel unit of the present embodiment, the second member 44*b* of each connector 40 disposed in the space S1 is operated by electric energy (electrical repulsion generated between the first member 44*a* and the second member 44*b*), thereby the switching mechanism is switchable between the first state illustrated in FIG. 4A and the second state illustrated in FIG. 4B.

The panel unit of the present embodiment further provides an advantage that application of a voltage is not required to maintain the switching mechanism in the first state, and an advantage that the electrode 45 is required only to be formed on the first panel 1.

In the figure, only one connector 40 is shown for the sake of simplicity, but one or more connectors 40 may be disposed in the space S1.

Fifth Embodiment

Figure 5A:
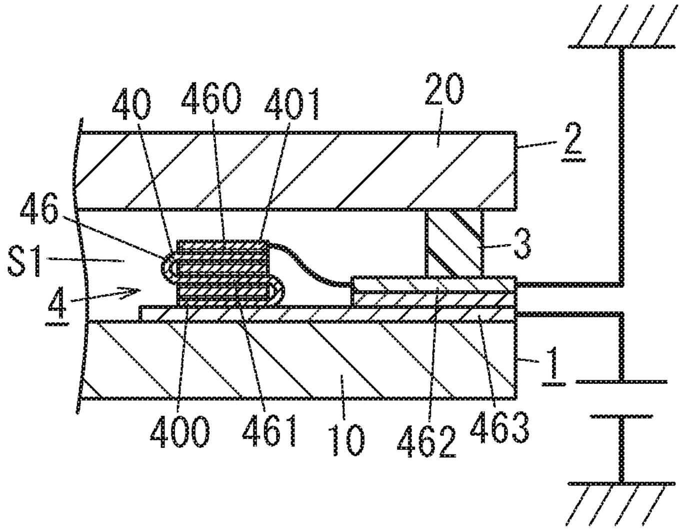
FIG. 5A is a sectional view schematically illustrating a first state of a main part of a panel unit of the fifth embodiment.
Figure 5B:
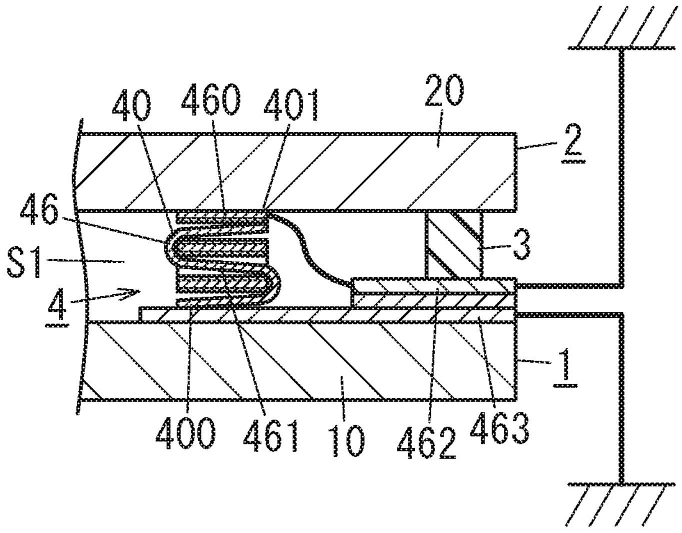
FIG. 5B is a sectional view schematically illustrating a second state of the main part of the panel unit of the fifth embodiment.

FIGS. 5A and 5B schematically illustrate a main part of a panel unit of the fifth embodiment.

In the present embodiment, the same components as those in the first embodiment will not be described in detail below, and components different from those shown in the first embodiment will be described in detail with reference to the drawings. In the figure, the same components as those in the first embodiment will be indicated by the same reference characters as those used in the first embodiment.

Similarly to the panel unit of the first embodiment, the panel unit of the present embodiment includes a first panel 1 and a second panel 2 between which a space S1 hermetically enclosed with a partition 3 is provided. In the space S1, a switching mechanism 4 is disposed and is operated by electric energy to switch the thermal conductivity.

In the panel unit of the present embodiment, the switching mechanism 4 includes connectors 40 each of which is formed as an electrostatic actuator 46. The electrostatic actuator 46 is an actuator configured to contract due to electrostatic force when applied with a voltage.

The electrostatic actuator 46 includes, for example, two electrode bodies 460 and 461 each of which has a strip shape and which are folded to alternately overlap each other, so that the entire electrostatic actuator 46 has a spring characteristic. The electrode bodies 460 and 461 each have thermal conductivity.

The electrostatic actuator 46 included in the connector 40 has one end serving as a fixed end 400 of the connector 40 and the other end located on an opposite side of the fixed end 400 and serving as a movable end 401 of the connector 40. Alternatively, only a part of the connector 40 may be formed as the electrostatic actuator 46.

The first panel 1 includes a panel 10 having gas barrier properties. The second panel 2 includes a panel 20 having gas barrier properties. The panel 10 of the first panel 1 has a surface which faces the second panel 2 and on which electrodes 462 and 463 for allowing application of a voltage across the electrostatic actuator 46 are stacked. The electrode 462 is electrically connected to one of the two electrode bodies 460 and 461 of the electrostatic actuator 46, and the electrode 463 is electrically connected to the other of the two electrode bodies 460 and 461.

When a predetermined voltage is applied between the two electrode bodies 460 and 461 of the electrostatic actuator 46 via the electrodes 462 and 463, the electrostatic actuator 46 contracts, thereby displacing the movable end 401. When the voltage is no longer applied to the electrostatic actuator 46, the electrostatic actuator 46 returns to its initial form due to its spring characteristic, thereby displacing the movable end 401 to its initial position.

The panel unit of the present embodiment is configured such that switching a state of application of a voltage (on/off of voltage application) to the electrostatic actuator 46 deforms the electrostatic actuator 46 in the space S1.

In the panel unit of the present embodiment, a state illustrated in FIG. 5A is referred to as a first state in which the movable end 401 is located away from the second panel 2. In the first state, a voltage is applied to the electrostatic actuator 46, thereby maintaining the electrostatic actuator 46 in a contracted state.

A state illustrated in FIG. 5B is referred to as a second state in which the movable end 401 is in thermally conductive contact with the second panel 2. In the second state, no voltage is applied to the electrostatic actuator 46. In the second state, the fixed end 400 is in thermally conductive contact with the first panel 1. The first panel 1 and the second panel 2 are in a thermally conductive state via the electrostatic actuator 46 included in the connector 40.

As described above, in the panel unit of the present embodiment, each connector 40 located in the space S1 is operated by electric energy (electrostatic force between the electrode bodies 460 and 461), and therefore, the switching mechanism is switchable between the first state illustrated in FIG. 5A and the second state illustrated in FIG. 5B.

The panel unit of the present embodiment further provides an advantage that application of a voltage is not required to maintain the switching mechanism in the second state, and an advantage that each connector 40 is rapidly deformable by a relatively small voltage.

In the figure, only one connector 40 is shown for the sake of simplicity, but one or more connectors 40 may be disposed in the space S1.

Sixth Embodiment

Figure 6A:
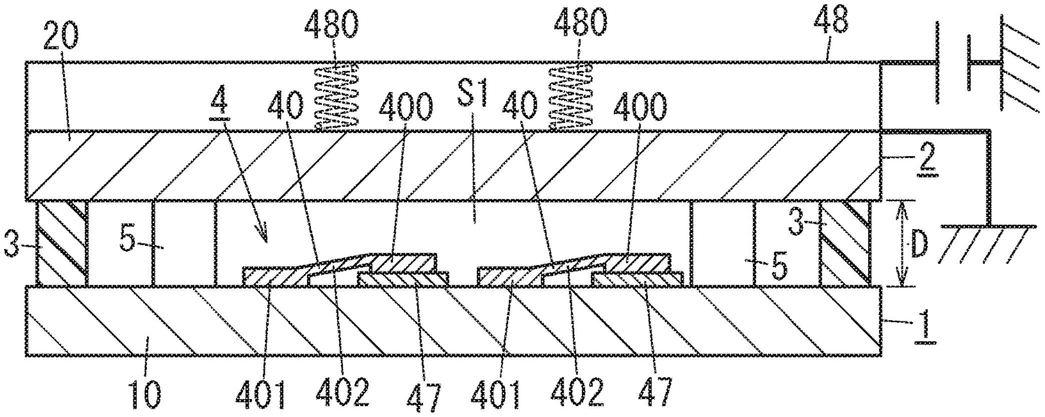
FIG. 6A is a sectional view schematically illustrating a first state of a panel unit of the sixth embodiment.
Figure 6B:
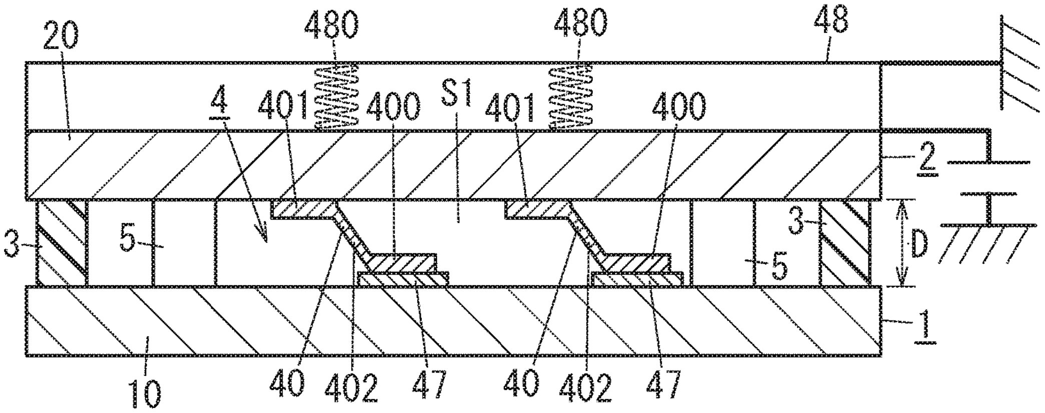
FIG. 6B is a sectional view schematically illustrating a second state of the panel unit of the sixth embodiment.

FIGS. 6A and 6B schematically illustrate a panel unit of the sixth embodiment.

In the present embodiment, the same components as those in the first embodiment will not be described in detail below, and components different from those shown in the first embodiment will be described in detail with reference to the drawings. In the figure, the same components as those in the first embodiment will be indicated by the same reference characters as those used in the first embodiment.

Similarly to the panel unit of the first embodiment, the panel unit of the present embodiment includes a first panel 1 and a second panel 2 between which a space S1 hermetically enclosed with a partition 3 is provided. In the space S1, a switching mechanism 4 is disposed and is operated to switch the thermal conductivity.

In the panel unit of the first embodiment, the electric energy given to the connector 40 is changed, whereas in the panel unit of the present embodiment, not the electric energy but magnetic energy given to the connector 40 is changed.

In the panel unit of the present embodiment, the first panel 1 includes a panel 10 having gas barrier properties. The second panel 2 includes a panel 20 having gas barrier properties. The space S1 is provided between the panels 10 and 20 facing each other. The partition 3 and spacers 5 are located between the panels 10 and 20 facing each other.

The panel 10 of the first panel 1 has a surface which faces the second panel 2 and on which a plurality of connectors 40 are fixed.

Each connector 40 is partially or entirely made of a thermally conductive magnetic substance. Each connector 40 includes a fixed end 400, a movable end 401, and a connection part 402 integrally. The fixed end 400 is fixed to the panel 10 of the first panel 1 via an adhesion part 47 having thermal conductivity.

Moreover, the switching mechanism 4 included in the panel unit of the present embodiment includes an electromagnetic block 48 which changes a magnetic field in the space S1. The electromagnetic block 48 is located on a side of the second panel 2 opposite to the first panel 1. In the panel unit of the present embodiment, the panel 20 of the second panel 2 has a surface which is opposite to the space S1 and on which the electromagnetic block 48 is stacked.

The electromagnetic block 48 accommodates a plurality of electromagnetic coils 480. The plurality of electromagnetic coils 480 are located at positions corresponding to the plurality of connector 40 in the space S1 on a one-to-one basis. The plurality of electromagnetic coils 480 generate magnetic fields in an identical direction when a voltage is applied.

When a voltage is applied to the electromagnetic block 48, the plurality of electromagnetic coils 480 generate magnetic fields in the space S1, thereby displacing the movable ends 401 by magnetic force.

The panel unit of the present embodiment is configured to change the magnetic field generated in the space S1 by switching a manner of application of a voltage across to the electromagnetic block 48.

FIG. 6A shows a first state of the panel unit of the present embodiment. In the first state, the magnetic field generated in the space S1 generates magnetic force in a direction in which the movable end 401 of the magnetic substance located in the magnetic field approaches the first panel 1.

In the first state, the fixed end 400 and the movable end 401 of each connector 40 are both in thermally conductive contact with the first panel 1 but are not in contact with the second panel 2.

FIG. 6B shows a second state of the panel unit of the present embodiment. In the second state, the magnetic field generated in the space S1 generates magnetic force in a direction in which the movable end 401 of the magnetic substance located in the magnetic field approaches the second panel 2. The direction of the magnetic field generated in the space S1 in the first state is opposite to the direction of the magnetic field generated in the space S1 in the second state.

In the second state, the fixed end 400 of each connector 40 is in thermally conductive contact with the first panel 1. The movable end 401 is in thermally conductive contact with the second panel 2. The first panel 1 and the second panel 2 are in a thermally conductive state via the connectors 40.

As described above, in the panel unit of the present embodiment, the switching mechanism is switchable between the first state in which each connector 40 made of a thermally conductive material is in thermally conductive contact with only the first panel 1 and the second state in which the connector 40 is in thermally conductive contact with both the first panel 1 and the second panel 2. According to the panel unit of the present embodiment, the thermal conductivity can be set to a very small value in the first state, and in the second state, the thermal conductivity to be set to a much larger value than that in the first state.

Also the panel unit of the present embodiment provides an advantage that only each connector 40 in the space S1 deforms in the first state and the second state, but the external shape of the panel unit does not change.

In the figure, two connectors 40 are shown for the sake of simplicity, but three or more connectors 40 may be provided, or only one connector 40 may be provided.

Seventh Embodiment

Figure 7A:
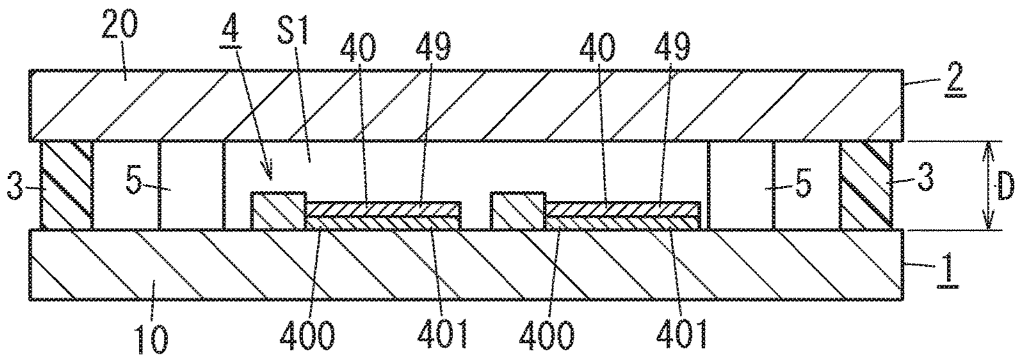
FIG. 7A is a sectional view schematically illustrating a first state of a panel unit of the seventh embodiment.
Figure 7B:
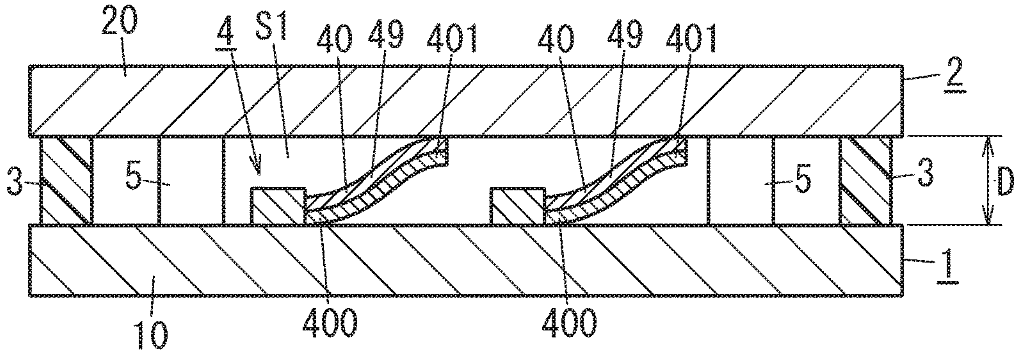
FIG. 7B is a sectional view schematically illustrating a second state of the panel unit of the seventh embodiment.

FIGS. 7A and 7B schematically illustrate a panel unit of the seventh embodiment.

In the present embodiment, the same components as those in the first embodiment will not be described in detail below, and components different from those shown in the first embodiment will be described in detail with reference to the drawings. In the figure, the same components as those in the first embodiment will be indicated by the same reference characters as those used in the first embodiment.

Similarly to the panel unit of the first embodiment, the panel unit of the present embodiment includes a first panel 1 and a second panel 2 between which a space S1 hermetically enclosed with a partition 3 is provided. In the space S1, a switching mechanism 4 is provided and is operated to switch the thermal conductivity.

In the panel unit of the first embodiment, the electric energy given to the connector 40 is changed, whereas in the panel unit of the present embodiment, not the electric energy but the thermal energy given to the connector 40 is changed.

In the panel unit of the present embodiment, the first panel 1 includes a panel 10 having gas barrier properties. The second panel 2 includes a panel 20 having gas barrier properties. The space S1 is provided between the panels 10 and 20 facing each other. The partition 3 and spacers 5 are located between the panels 10 and 20 facing each other.

The panel 10 of the first panel 1 has a surface which faces the second panel 2 and on which a plurality of connectors 40 are fixed.

Each connector 40 is formed as a thermal actuator 49 which is thermally conductive. The thermal actuator 49 has a plate shape and is made of bimetal having a structure including a plurality of thin plates adhering to each other. The plurality of thin plates have different coefficients of thermal expansion. As long as the thermal actuator 49 is configured to operate through a thermal change, the thermal actuator 49 may be made of other materials such as a shape-memory alloy.

The connector 40 included in the panel unit of the present embodiment is entirely formed as the thermal actuator 49. The thermal actuator 49 has one end serving as a fixed end 400 of the connector 40. The thermal actuator 49 has the other end which is located opposite to the fixed end 400 and serves as a movable end 401 of the connector 40. Alternatively, the connector 40 may be partially formed as the thermal actuator 49.

In the panel unit of the present embodiment, when a temperature in the space S1 changes due to, for example, external application of heat, the thermal actuator 49 deforms, thereby displacing the movable end 401. When the temperature in the space S1 returns to an initial temperature, the thermal actuator 49 returns to its initial form, thereby displacing the movable end 401 to its initial position.

FIG. 7A shows a first state of the panel unit of the present embodiment. In the first state, the movable end 401 is located away from the second panel 2.

FIG. 7B shows a second state of the panel unit of the present embodiment. In the second state, the movable end 401 is in thermally conductive contact with the second panel 2. The first panel 1 and the second panel 2 are in a thermal conductive state via the thermal actuator 49 included in the connector 40.

As described above, in the panel unit of the present embodiment, the switching mechanism is switchable between the first state in which each connector 40 made of thermally conductive bimetal is in thermally conductive contact with only the first panel 1 and the second state in which the connector 40 is in thermally conductive contact with both the first panel 1 and the second panel 2. The panel unit of the present embodiment enables in the first state, the thermal conductivity to be set to a very small value, and in the second state, the thermal conductivity to be set to a much larger value than that in the first state.

Also the panel unit of the present embodiment provides an advantage that only each connector 40 in the space S1 deforms in the first state and the second state, but the external shape of the panel unit does not change.

Similarly to the panel unit of the first embodiment, also in the panel unit of the present embodiment, the partition 3 may be made of a material, such as glass fiber, resin fiber, etc., without gas barrier properties. In this case, the space S1 is not enclosed in an airtight manner, but it becomes easy to use a highly thermal resistive material as a material for the partition 3, and therefore, in particular, the panel unit of the present embodiment provides a significant advantage.

In the figure, two connectors 40 are shown for the sake of simplicity, but three or more connectors 40 may be provided, or only one connector 40 may be provided.

(Application Example of Panel Unit)

Figure 8A:
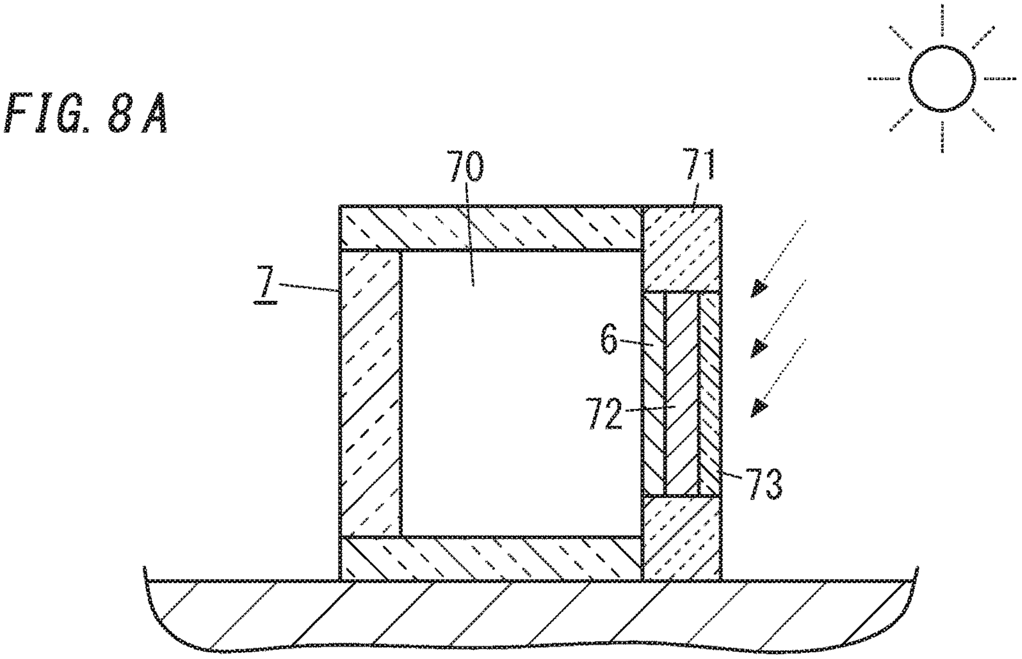
FIG. 8A is a sectional view schematically illustrating a building including the panel unit of any one of the first to seventh embodiments.
Figure 8B:
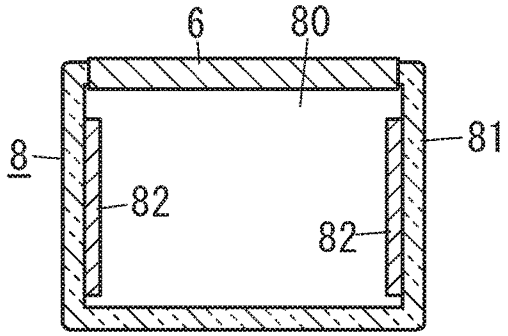
FIG. 8B is a sectional view schematically illustrating an atmosphere calcining furnace including the panel unit of any one of the first to seventh embodiments.
Figure 8C:
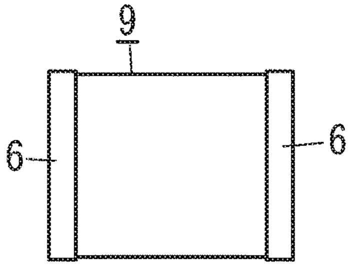
FIG. 8C is a front view schematically illustrating an engine including the panel unit of any one of the first to seventh embodiments.

FIGS. 8A, 8B, and 8C schematically illustrate techniques in which the panel unit of any one of the first to seventh embodiments may be used. A panel 6 illustrated in each of the figures is a panel made of the panel unit of any one of the first to seventh embodiments to have a variable thermal conductivity.

FIG. 8A shows a case where the panel 6 having a variable thermal conductivity is used as a building material of a building 7. The building 7 has an indoor space 70. The indoor space 70 is laterally surrounded by a thermal insulation wall 71 in part of which the panel 6, a heat storage panel 72, and a thermally insulated glass panel 73 are installed.

The thermally insulated glass panel 73 is located on an outermost side, the heat storage panel 72 is located on an indoor side of the thermally insulated glass panel 73, and the panel 6 is located on an indoor side of the heat storage panel 72. The thermally insulated glass panel 73 faces an outdoor space, and the panel 6 faces the indoor space 70.

The panel 6 enables a significant change in thermal conductivity in indoor and outdoor directions. A state in which the thermal conductivity of the panel 6 is set to a small value corresponds to the first state described in each of the first to seventh embodiments. The panel 6 in a state (first state) in which the thermal conductivity is set to a small value is in a so-called thermal insulation mode. The panel 6 in a state (second state) in which the thermal conductivity is set to a large value is in a so-called heat dissipation mode.

In the building 7 illustrated in FIG. 8A, while the panel 6 is set in the thermal insulation mode, the heat storage panel 72 is heated by being irradiated with sunlight through the thermally insulated glass panel 73, and at a timing at which the temperature of the indoor space 70 is to be increased, the panel 6 is switched from the thermal insulation mode to the heat dissipation mode. At this time, heat stored in the heat storage panel 72 is conducted to the indoor space 70 through the panel 6, thereby heating the indoor space 70.

According to the system of the building 7 illustrated in FIG. 8A, thermal energy of sunlight is directly utilized to adjustably heat the indoor space 70.

FIG. 8B shows a case where a panel 6 having a variable thermal conductivity is used as a wall material of an atmosphere calcining furnace 8. The atmosphere calcining furnace 8 has a calcining space 80, and the calcining space 80 is surrounded by a thermal insulation wall 81 in part of which the panel 6 is installed.

In the calcining space 80, a heater 82 for calcining is disposed. The calcining space 80 is filled with gas such as nitrogen or has a pressure reduced to a predetermined degree of vacuum.

The panel 6 in a state in which the thermal conductivity is set to a small value is in a so-called thermal insulation mode. The panel 6 in a state in which the thermal conductivity is set to a large value is in a so-called heat dissipation mode.

In the atmosphere calcining furnace 8 illustrated in FIG. 8B, when the temperature in the calcining space 80 is increased or maintained, the panel 6 is set in the thermal insulation mode. At a timing at which the calcining space 80 is cooled, the panel 6 is switched from the thermal insulation mode to the heat dissipation mode.

The system of the atmosphere calcining furnace 8 illustrated in FIG. 8B enables effective cooling of the calcining space 80 without opening the calcining space 80.

FIG. 8C shows a case where a panel 6 having a variable thermal conductivity is used for adjusting a temperature of an engine 9. The panel 6 is disposed in a position in contact with or in the vicinity of the engine 9 so as to cover at least a part of the engine 9.

The panel 6 in a state in which the thermal conductivity is set to a small value is in a so-called thermal insulation mode. The panel 6 in a state in which the thermal conductivity is set to a large value is in a so-called heat dissipation mode.

In the engine 9 illustrated in FIG. 8C, while the engine 9 is operating, the panel 6 is set in the heat dissipation mode, whereas when the engine 9 is stopped, the panel 6 is switched from the heat dissipation mode to the thermal insulation mode. According to this system, energy can be saved during the operation of the engine 9.

Features of Embodiments

As described with reference to the drawings, the panel unit of each of the first to seventh embodiments includes the first panel 1, the second panel 2, the partition 3, and the switching mechanism 4. The second panel 2 and the first panel 1 face each other with a space S1 provided therebetween. The partition 3 is located between the first panel 1 and the second panel 2 and separates the space S1 from a surrounding space. The switching mechanism 4 is located in the space S1 for allowing a change in the thermal conductivity between the first panel 1 and the second panel 2.

The switching mechanism 4 includes at least one connector 40 which is thermally conductive, and the switching mechanism 4 is switchable between a first state in which the at least one connector 40 is out of contact with the first panel 1 or the second panel 2 and a second state in which the at least one connector 40 is in thermally conductive contact with both the first panel 1 and the second panel 2.

Therefore, according to the panel unit of each of the first to seventh embodiments, the thermal conductivity can be significantly changed by changing the state (form) of the at least one connector 40 without changing the externals shape of the entire unit.

Note that in the panel unit of each of the first to seventh embodiments, the connector 40 is configured to be out of contact with the second panel 2 in the first state and in contact with the second panel in the second state. However, the connector 40 may be configured to be out of contact with the first panel 1 in the first state and in contact with the first panel 1 in the second state. Alternatively, a connector 40 configured to be out of contact with the second panel 2 in the first state and in contact with the second panel 2 in the second state and a connector 40 configured to be out of contact with the first panel 1 in the first state and in contact with the first panel 1 in the second state may be separately provided in the space S1.

In the panel unit of each of the first to seventh embodiment, the space S1 is preferably a thermal insulation space having a reduced pressure or being filled with a thermal insulating gas.

The space S1 is a thermal insulation space having high thermal insulating properties, and therefore, the thermal conductivity between the first panel 1 and the second panel 2 can significantly be changed between the first state and the second state.

In the panel unit of each of the first to seventh embodiments, the space S1 is preferably a thermal insulation space having a reduced pressure, and a mean free path $\lambda$ of gas in the space S1 and a distance D between the first panel 1 and the second panel 2 are preferably in a relationship expressed as $\lambda/D>0.3$.

When this relationship is satisfied, a property that the thermal conductivity between the first panel 1 and the second panel 2 does not depend on the distance D is obtained. That is, the distance D can be set to a small value without influencing the thermal conductivity, and therefore, the thickness of the panel unit is easily reduced.

The panel unit of each of the first to seventh embodiment further includes a spacer 5 maintaining the distance D between the first panel 1 and the second panel 2.

Therefore, in the panel unit of each of the first to seventh embodiments, the distance D between the first panel 1 and the second panel 2 is secured by the spacer 5, thereby stably forming the space S1. At least one spacer 5 is disposed in the space S1.

In the panel unit of each of the first to seventh embodiments, the connector 40 includes a fixed end 400 fixed to one of the first panel 1 and the second panel 2, and a movable end 401 which is fixed to neither the first panel 1 nor the second panel 2, and the movable end 401 is out of contact with the other one the first panel 1 and the second panel 2 in the first state, and the movable end 401 is in thermally conductive contact with the other one of the first panel 1 and the second panel 2 in the second state.

Therefore, in the panel unit of each of the first to seventh embodiment, displacing the movable end 401 in the space S1 enables a significant change in thermal conductivity between the first panel 1 and the second panel 2.

In the panel unit of each of the first to fifth embodiments, the connector 40 causes the movable end 401 to be displaced in the space S1 due to a change in electric energy given thereto. Examples of changing the electric energy may include changing the electric field in the space S1 and changing a voltage applied across the connector 40.

Therefore, in the panel unit of each of the first to fifth embodiments, controlling electric energy given to the connector 40 located in the space S1 enables a significant change in thermal conductivity between the first panel 1 and the second panel 2.

In the panel unit of the first and second embodiments, the connector 40 is entirely or partially made of a conductor such that changing the electric field in the space S1 displaces the movable end 401 in the space S1.

In the panel unit of the third embodiment, the connector 40 is entirely or partially formed as a piezoelectric actuator 42 such that applying a voltage thereacross displaces the movable end 401 in the space S1.

In the panel unit of the fourth embodiment, the at least one connector 40 is configured to generate electrical repulsion for displacing the movable end 401 in the space S1 when a voltage is applied thereacross.

In the panel unit of the fifth embodiment, the connector 40 is entirely or partially formed as an electrostatic actuator 46 such that applying a voltage thereacross displaces the movable end 401 in the space S1.

In the panel unit of the sixth embodiment, the connector 40 causes the movable end 401 to be displaced in the space S1 due to a change in magnetic energy given thereto. The embodiment that the magnetic energy is changed includes an embodiment that the magnetic field in the space S1 is changed.

Therefore, in the panel unit of the sixth embodiment, controlling magnetic energy given to the connector 40 located in the space S1 enables a significant change in thermal conductivity between the first panel 1 and the second panel 2.

The connector 40 is preferably entirely or partially made of a magnetic substance such that changing a magnetic field in the space S1 displaces the movable end 401 in the space S1.

In the panel unit of the seventh embodiment, the connector 40 causes the movable end 401 to be displaced in the space S1 due to a change in thermal energy given thereto. Examples of changing the thermal energy may include changing the temperature of the connector 40.

Therefore, in the panel unit of the seventh embodiment, controlling thermal energy given to the connector 40 located in the space S1 enables a significant change in thermal conductivity between the first panel 1 and the second panel 2.

The connector 40 is preferably entirely or partially made of bimetal or a shape-memory alloy such that changing a temperature in the space S1 displaces the movable end 401 in the space S1.

The panel units of the embodiments have been described above, but the panel units of the embodiments may be accordingly modified in design or the configurations of the panel units of the embodiments may be accordingly combined with each other.

The invention claimed is:

1. A panel unit, comprising:

a first panel;

a second panel facing the first panel with a space provided between the first panel and the second panel;

a partition located between the first panel and the second panel and separating the space from a surrounding space; and a switching mechanism located in the space for allowing a change in thermal conductivity between the first panel and the second panel, the switching mechanism including at least one connector which is thermally conductive, the switching mechanism being switchable between a first state in which the at least one connector is out of contact with the first panel or the second panel and a second state in which the at least one connector is in thermally conductive contact with both the first panel and the second panel, the space is a thermal insulation space having air whose pressure has been reduced to or below a predetermined value, and a mean free path λ of the air and a distance D between the first panel and the second panel are in a relationship expressed as $\lambda/D>0.3$.

2. The panel unit according to claim 1, further comprising:

a spacer maintaining a distance between the first panel and the second panel.

3. The panel unit according to claim 1, wherein the at least one connector includes a fixed end fixed to one of the first panel and the second panel, and a movable end fixed to neither the first panel nor the second panel, the movable end is out of contact with the other of the first panel and the second panel in the first state and is in thermally conductive contact with the other of the first panel and the second panel in the second state.

4. The panel unit according to claim 3, wherein the at least one connector causes displacement of the movable end in the space due to a change in electric energy given thereto.

5. The panel unit according to claim 4, wherein the at least one connector is entirely or partially made of a conductor such that changing an electric field in the space displaces the movable end in the space.

6. The panel unit according to claim 4, wherein the at least one connector is entirely or partially formed as a piezoelectric actuator such that applying a voltage thereacross the connector displaces the movable end in the space.

7. The panel unit according to claim 4, wherein the at least one connector is configured to generate electrical repulsion for displacing the movable end in the space when a voltage is applied thereacross.

8. The panel unit according to claim 4, wherein the at least one connector is entirely or partially formed as an electrostatic actuator such that applying a voltage thereacross displaces the movable end in the space.

9. The panel unit according to claim 3, wherein the at least one connector causes displacement of the movable end in the space due to a change in magnetic energy given thereto.

10. The panel unit according to claim 9, wherein the at least one connector is entirely or partially made of a magnetic substance such that changing a magnetic field in the space displaces the movable end in the space.

11. The panel unit according to claim 3, wherein the at least one connector causes displacement of the movable end in the space due to a change in thermal energy given thereto.

12. The panel unit according to claim 11, wherein the at least one connector is entirely or partially made of bimetal such that changing a temperature in the space displaces the movable end in the space.

13. The panel unit according to claim 11, wherein the at least one connector is entirely or partially made of a shape-memory alloy such that changing a temperature in the space displaces the movable end in the space.

* * * * *